United States Patent
Huang et al.

(10) Patent No.: US 6,553,335 B2
(45) Date of Patent: Apr. 22, 2003

(54) METHOD AND APPARATUS FOR DETERMINING END-POINT IN A CHAMBER CLEANING PROCESS

(75) Inventors: Jim-Jey Huang, Chai (TW); Tain-Chen Hu, Ping-tung (TW); Jui-Ping Chuang, Hsin Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 09/886,838

(22) Filed: Jun. 21, 2001

(65) Prior Publication Data
US 2002/0198682 A1 Dec. 26, 2002

(51) Int. Cl.[7] .............................................. G06E 11/30
(52) U.S. Cl. ..................................................... 702/184
(58) Field of Search ................................ 702/184, 188; 216/59, 60; 156/345.16, 345.25; 73/24.06, 25.05; 134/1.1

(56) References Cited

U.S. PATENT DOCUMENTS

| 5,016,663 | A | * | 5/1991 | Mase et al. ..................... 134/1 |
| 6,079,426 | A | * | 6/2000 | Subrahmanyam et al. ... 134/1.1 |
| 6,117,348 | A | * | 9/2000 | Peng et al. ..................... 216/60 |
| 6,295,861 | B1 | * | 10/2001 | Tom et al. .................. 73/24.06 |

* cited by examiner

Primary Examiner—Michael Nghiem
(74) Attorney, Agent, or Firm—Tung & Associates

(57) ABSTRACT

A method for determining end-point in a chamber cleaning process is disclosed which can be carried out by first providing a chamber that has a cavity for conducting a semiconductor fabrication process therein, then mounting a crystal sensor on a surface of the chamber cavity at a position that the sensor is exposed to gases or liquids or generated by the fabrication process; conducting a semiconductor fabrication process in the chamber; flowing a cleaning fluid into and in-situ cleaning the surface of the chamber cavity; inputting an oscillating frequency into the crystal sensor and monitoring an output frequency of oscillation from the sensor; and comparing the output frequency of oscillation to an output frequency from a crystal sensor that has a clean surface and determining when the surface of the chamber cavity is cleaned.

15 Claims, 2 Drawing Sheets

METHOD AND APPARATUS FOR DETERMINING END-POINT IN A CHAMBER CLEANING PROCESS

FIELD OF THE INVENTION

The present invention generally relates to a method and an apparatus for determining the end-point of a chamber cleaning process and more particularly, relates to a method and apparatus for determining the end-point of a chamber cleaning process that does not require a spectroscopic technique for such determination.

BACKGROUND OF THE INVENTION

In the fabrication and processing of semi-conductor devices, such as silicon wafers, a variety of different semi-conductor equipment and/or tools are utilized. These tools and equipment are well-known in the art, and include for example, photolithographic machines, etchers, deposition equipment, furnaces, as well as a variety of sensors and control equipment. Although the capabilities of these types of semi-conductor processing equipment have improved over the years, the technique of monitoring the ongoing process has not necessarily kept pace with the improvements. In the area of monitoring the ongoing semi-conductor manufacturing process, current practices generally utilize ex-situ process monitoring. A problem with ex-situ monitoring is that the results are not available until the end of the process, or if in-situ readings are required, the ongoing process must necessarily be uninterrupted in order to obtain the required reading. Moreover, where a number of parameters are monitored for a given process, it is difficult to determine the dependency of one parameter to the others. Such processing parameter correlations are difficult to obtain, and are made even more difficult when measurements are being taken for the purpose of providing in-situ control of the ongoing process.

As mentioned above, one of the processes involved in manufacturing semi-conductor devices is etching. A number of etching technologies may be employed, such as reactive ion etching (RIE) for etching a fine line or small via patterns in a silicon wafer. RIE involves positioning a masked wafer in a chamber containing plasma. The plasma contains etchant gases which are vertically disassociated in an RF so that the reactive ions contained in the etchant gases are accelerated to the wafer surface. The accelerated reactive ions combine chemically with unmasked material on wafer's surface.

In connection with the plasma etching process, it is known to monitor the progress of the etching process by measuring the intensity of the plasma emissions at a specific wavelength. Changes in the level of intensity of the plasma at the wavelength of interest can be correlated to the progress of the etching process, consequently this technique may be employed to determine the time at which the etching process should be ended, such time point being commonly referred to in the art as the "end-point" time. It is further known that during normal, stable operating conditions, the end-point, as determined by a change in the monitored wavelength, should be within a certain range. However, certain processing conditions, indicative of an unstable processing condition or other problems affect the end-point time. For example, incorrect process parameters, wrong recipes, improper part installation during maintenance, chamber or line leakage and other similar problems result in an unstable process which is normally not detected until a batch, or even a complete lot of wafers has been processed. This after-the-fact detection of unstable processing conditions results in substantial scrap and decreased yield.

Although it is known that a change in the monitored wavelength of the plasma is correlatable to the end-point time, such information has not been effectively employed for early detection of unstable processing conditions, and particularly with respect to batch-to-batch and lot-to-lot processing variations that reduce yield.

In U.S. Pat. No. 6,117,348, issued Sep. 12, 2000 and assigned to the common assignee of the present invention, a method for the real time monitoring of a plasma etching process as well as an apparatus for performing the same are disclosed. The method monitors a plasma etching process employed to produce multiple batches or lots of semiconductor devices, such as silicon wafers. The method broadly comprises the steps of detecting a change in a characteristic of the plasma during etching of a wafer or a wafer batch; recording the time when the change in the characteristic is detected, such recorded time representing the duration of the etching and defining an end-point value; comparing the end-point value with one or more reference values corresponding to stable process conditions; and, issuing a notice of unstable process conditions based on the results of the comparison. The characteristic to be detected preferably comprises a change in the intensity of a specific wavelength generated by the plasma employed to perform the etching. The method also includes the step of storing a plurality of end-point values respectively recorded during the etching of a plurality of corresponding wafers, and employing these stored values as a reference with which a monitored end-point value is compared.

The patent also discloses an apparatus for carrying out the method, including means for sensing a particular wavelength of interest emitted by the plasma, means for analyzing the monitored wavelength, and for detecting a change in the intensity of such wavelength, and a program controller for calculating an end-point valve using the measured changes in wavelength intensity and for comparing the measured end-point with one or more reference values corresponding to stable processing conditions.

FIG. 1 depicts the primary components of a typical reactive ion etching system, as well as the components forming the real time monitoring system. A wafer 14 to be etched, typically a masked wafer, is placed on a cathode 16 inside a plasma chamber 12 filled with plasma, all of which components form a part of a plasma etching apparatus 10. Although the reactive ion etching system shown in FIG. 1 employs a cathode 16 as the heating source, a system in which both the anode and cathode are powered can also be utilized. A gas supply 20 provides the necessary etchant gas to the plasma in the chamber 12, and a pump 22 is employed for evacuating plasma discharge during etching. An RF generator 18 supplies RF power to the cathode 16 so as to form an RF field in the plasma. The RF field causes reactive ions contained in the etchant gas to accelerate to the surface of the wafer 14. The thus accelerated reactive ions combine chemically with unmasked material on the surface of the wafer so as to form volatile etch product. The volatile etch product is released into the plasma and a plasma chamber 12 and a plasma discharges is formed. This discharge includes the emissions of light at specific wavelengths which are determined by the particular gases and materials employed in the process. For example, a CO plasma employed to etch an oxide surface emits light at a wavelength of 480–485 nm, an Al plasma used to etch metal substrates emits light at a wavelength of 396 nm, and a SF plasma used to etch a polysilicon substrate emits light at a wavelength of approximately 400 nm.

As shown in FIG. 1, changes in the level of intensity of the wavelength emitted by the plasma in the chamber 12 are continuously monitored by a suitable sensor 24 which transmits the monitored wavelength via a line, which may comprise an optical fiber 26, to a device such as a spectrometer 28, which in turn outputs a signal to the device such as a multi-channel analyzer 30 which isolates the wavelength of interest and measures its intensity. The measured intensity, as well as changes therein, is transmitted by the analyzer 30 to a programmed controller 32 which includes a microprocessor controller 34 provided with suitable memory 36 for storing end-point time reference values. The microprocessor 34 operates in accordance with a set of programmed instructions which receives data from the analyzer 30 relating to changes in the monitored wavelength, determines the end-point time for a wafer or batch of wafers being processed, and compares the end-point time with one of the reference values. Based on the results of the comparison thus performed, the controller 32 may issue a notice announcing that the etching process has become unstable and/or issue instructions which result in either alteration or termination of the etching process within the etching apparatus 10.

A typical spectrograph of a chamber cleaning process is shown in FIG. 2.

As shown in FIG. 2, at the beginning of a cleaning process, the plasma gas generated in the resonant cavity includes $NF_3$ and $SiF_x$. As time progresses, the plasma gas generated in the plasma chamber 12 changes to substantially $NF_3$ toward the end of a cleaning process. A close examination of FIG. 2 indicates that, in zone A during the initial cleaning period, i.e. in the first 10 min. when a cleaning gas of $NF_3$ is flown into the chamber, the chamber interior is contaminated with silicon oxide particles, flakes or films. In zone A, the plasma radiation brightness is not detected since cleaning gas $NF_3$ is substantially consumed in converting the silicon oxide to $SiF_x$. The plasma radiation brightness for $NF_3$ is therefore not detected in zone A.

As the cleaning process progresses, as shown in zone B, the plasma radiation brightness of the microwave excited $NF_3$ ions is picked-up in a plateau region while a small percentage of $SiF_x$ is still present in the exhaust gas mixture. While $NF_3$ cleaning gas continuously flows into the process chamber interior, the cleaning gas $NF_3$ is also consumed simultaneously, resulting in a constant radiation brightness (i.e. a plateau region) being detected.

Toward the end of the cleaning process, as shown by zone C, the concentration of the cleaning gas $NF_3$ rapidly increases in the process chamber (or the resonant cavity) 14, while the concentration of the reaction product of $SiF_x$ rapidly decreases because silicon oxide is substantially converted. In zone C, lesser silicon oxide and more $NF_3$ is shown.

In the final stage of the cleaning process, as shown in zone D, the chamber interior (or the resonant cavity) 14 is filled substantially with unreacted cleaning gas $NF_3$, while all silicon oxide has been converted and therefore no $SiF_x$ intensity is shown. The plateau region in zone D further indicates a completion, i.e. an endpoint, of the chamber interior cleaning process. In the plateau region shown in zone D, the slope of the curve becomes zero which is indicative of the endpoint for the cleaning process.

The spectroscopic endpoint detection system for the chemical vapor deposition chamber cleaning process, and the method for detecting an endpoint of a chemical vapor deposition chamber cleaning process disclosed in the copending application have been used with some success. However, the optical detection method has its limitations such as an elaborate calibration procedure is required in order to ensure its accuracy and the spectroscopic windows to the chamber must be cleaned without any film deposition in order to obtain a true reading of the chamber condition.

It is therefore an object of the present invention to provide a method for determining end-point in a chamber cleaning process that does not have the drawbacks or shortcomings of the conventional detection methods.

It another object of the present invention to provide a method for determining end-point in a chamber cleaning process without utilizing an optical technique.

It is a further object of the present invention to provide a method for determining end-point in a chamber cleaning process that does not require a spectroscopic technique.

It is another further object of the present invention to provide a method for determining end-point in a chamber cleaning process in which a crystal sensor is utilized.

It is still another object of the present invention to provide a method for determining end-point in a chamber cleaning process in which a crystal sensor formed of a quartz crystal is utilized as the sensing element.

It yet another object of the present invention to provide a method for determining end-point in a chamber cleaning process by inputting an oscillating frequency into a crystal sensor and monitoring an output frequency of oscillation from the sensor.

It is still another further object of the present invention to provide a method for determining end-point in a chamber cleaning process by exciting a crystal sensor mounted in the chamber cavity into mechanical motion by an external oscillator and then monitoring an output frequency of oscillation from the sensor.

It is yet another further object of the present invention to provide a semiconductor process chamber that is equipped with an end-point detection apparatus of a crystal sensor by monitoring its oscillating frequency to determine an end-point for a chamber cleaning process.

SUMMARY OF THE INVENTION

In accordance with the present invention, a method and an apparatus for determining end-point in a chamber cleaning process of a semiconductor process chamber are provided.

In a preferred embodiment, a method for detecting end-point in a chamber cleaning process that can be carried out by the operating steps of providing a chamber that has a cavity for conducting a semiconductor fabrication process therein; mounting a crystal sensor on a surface of the chamber cavity at a position that the sensor is exposed to gases or liquids used or generated by the fabrication process; conducting the semiconductor fabrication process in the chamber; flowing a cleaning fluid into and in-situ cleaning the interior surface of the chamber cavity; inputting an oscillating frequency into the crystal sensor and monitoring an output frequency of oscillation from the sensor; and comparing the output frequency of oscillation to an output frequency from a crystal sensor that has a clean surface and determining when the interior surface of the chamber is cleaned.

The method for determining end-point in a chamber cleaning process may further include the step of mounting a crystal sensor that includes a quartz crystal as the basic transducing element, or the step of mounting a crystal sensor that includes a quartz crystal in the shape of a flat circular plate, or the step of mounting a crystal sensor including a quartz crystal in the shape of a flat circular plate having a diameter of about 1.5 cm and a thickness of about 0.2 mm. The method may further include the step of inputting an oscillating frequency of at least 3 megahertz into the crystal sensor. The method may further include the step of providing a chamber that is a plasma etch chamber, or a chemical vapor deposition chamber, or a sputtering chamber. The method may further include the step of defining an end of the chamber cleaning process when the output frequency of oscillation is not more than 20% smaller than the output frequency from a crystal sensor that has a clean surface, or the step of defining the end of the chamber cleaning process when the output frequency of oscillation is preferably not more than 10% smaller than the output frequency from a crystal sensor that has a clean surface. The method may further include the step of exciting the crystal sensor into mechanical motion by an external oscillator, or the step of cooling the crystal sensor during the monitoring step for the output frequency of oscillation from the crystal sensor.

The present invention is further directed to a semiconductor process chamber that is equipped with an end-point detection apparatus for a chamber cleaning process that includes a chamber that has a cavity for conducting a fabrication process therein; a crystal sensor mounted on a surface of the cavity exposed to process and cleaning fluids used in the cavity; an external oscillator for providing mechanical motion to the crystal sensor; and a process controller for sensing an output oscillating frequency from the crystal sensor and comparing it to an output oscillating frequency from a crystal sensor that does not have a film coating on top.

In the semiconductor process chamber that is equipped with an end-point detection apparatus for a chamber cleaning process, the chamber may be selected from a plasma etch chamber, a chemical vapor deposition chamber or a sputter chamber. The crystal sensor may include a quartz crystal, or a quartz crystal that has a diameter of at least 1 cm and a thickness of at least 0.1 mm. The external oscillator provides an oscillating frequency of at least 3 megahertz. The crystal sensor may further include a cooling means such that it can be operated at chamber temperatures up to 300° C.

BRIEF DESCRIPTION OF THE DRAWINGS

These and other objects, features and advantages of the present invention will become apparent from the following detailed description and the appended drawings in which.

DETAILED DESCRIPTION OF THE PERFERRED EMBODIMENT

Figure 1:
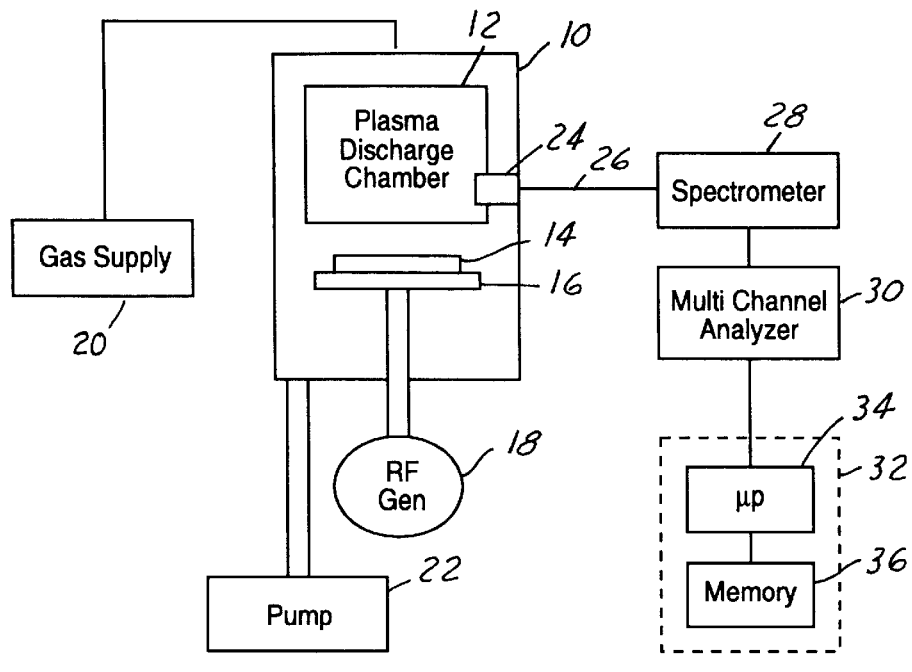
FIG. 1 is a combined block and diagrammatic view of a plasma etching system employing a real-time monitoring apparatus.
Figure 2:
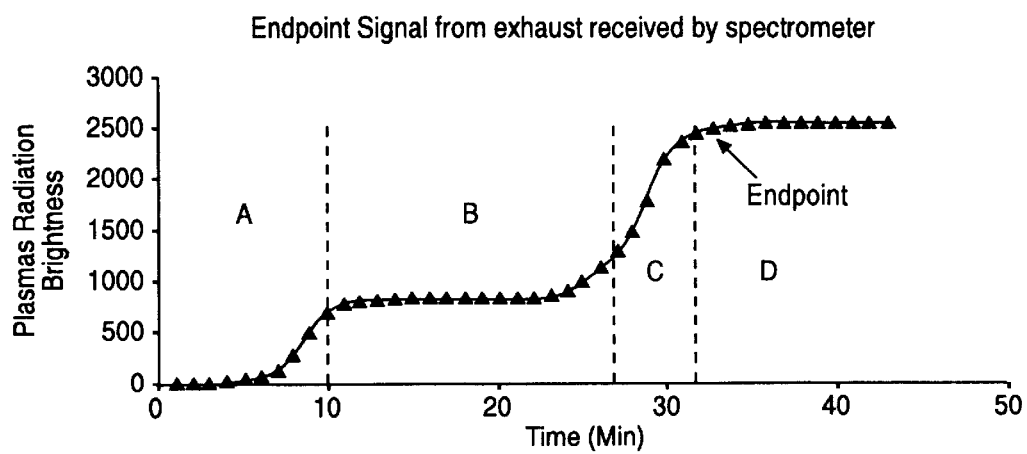
FIG. 2 is a graph illustrating changes in plasma radiation brightness vs. time for a spectroscopic end-point detection method.

The present invention discloses a method for determining end-point in a chamber cleaning process of a semiconductor process chamber which can be carried out by first providing a chamber that has a cavity for conducting a semiconductor fabrication process; mounting a crystal sensor on a surface of the chamber cavity at a position that the sensor is exposed to gases or liquids used or generated by the fabrication process; conducting a semiconductor fabrication process in the chamber; flowing a cleaning fluid into the chamber cavity and in-situ cleaning the interior surface of the chamber cavity; inputting an oscillating frequency into the crystal sensor and monitoring an output frequency of oscillation from the crystal sensor; and comparing the output frequency of oscillation to an output frequency from a crystal sensor that has a clean surface for determining when the interior surface of the chamber cavity is cleaned.

The present invention further discloses a semiconductor process chamber that is equipped with an end-point detection apparatus for monitoring a chamber cleaning process which includes a chamber that has a cavity for conducting a fabrication process therein; a crystal sensor mounted on a surface of the chamber cavity exposed to process and cleaning fluids used in the cavity; an external oscillator for providing mechanical motion to the crystal sensor; and a process controller for sensing an output oscillating frequency from the crystal sensor and comparing it to an output oscillating frequency from a crystal sensor that does not have a film coating on top.

A typical crystal sensor may be utilized is one formed of a quartz crystal, in the shape of a flat circular disk that has a diameter of at least 1 cm, and preferably at least 1.5 cm, and a thickness of at least 0.1 mm, and preferably a thickness of at least 0.2 mm. The crystal sensor is to receive an external oscillator signal which has an oscillating frequency of at least 3 megahertz, and preferably having an oscillating frequency of at least 6 megahertz. The crystal sensor may further include a water cooling jacket such that the sensor may function properly in a heated environment of the chamber cavity of up to 300° C.

By practicing the present novel method, it has been determined that a suitable definition of an end-point of the chamber cleaning process as the point where an output frequency of oscillation is not more than 20% smaller than an output frequency from the same crystal sensor which has a clean surface, and preferably an output frequency of oscillation that is not more than 10% smaller than the output frequency from the same crystal sensor that has a clean surface. For instance, when a crystal sensor normally outputs an oscillation frequency of 6 megahertz, any output frequency of oscillation of higher than 4.8 megahertz, and preferably higher than 5.4 megahertz, received from the crystal sensor mounted inside the chamber cavity indicates that the chamber cleaning process has been completed.

The chamber cleaning process has become very important in thin film deposition during semiconductor fabrication. The present invention novel method fulfills a great challenge which is the achievement in chamber cleaning efficiency. The present invention novel method can be used to suitably determine the chamber cleanliness condition and is more efficient than conventional optical end-point detection methods and furthermore, more reliable. By utilizing the present invention novel method and apparatus, the chamber particle performance of the deposition chamber can be stabilized and thus extending the chamber life before a preventative maintenance procedure is necessary. By reducing the particle failure rate, the cost of the fabrication process can be reduced.

The present invention novel method and apparatus fulfills the goal that any contaminating film adhered on the chamber walls can be cleaned and removed. By monitoring a crystal sensor frequency deviation, the chamber wall cleanliness condition can be determined. The particle failure rate can thus be reduced by the appropriate clean time and furthermore, the chamber equipment up-time may be increased. The invention can be utilized to detect either a conductive film or a non-conductive film that is adhered on the chamber walls.

Figure 3:
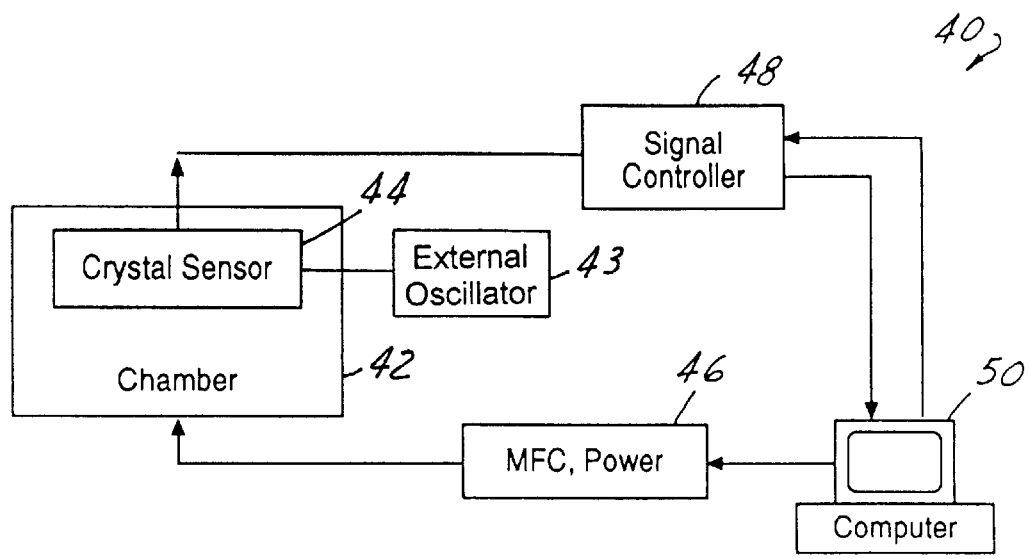
FIG. 3 is a block diagram illustrating the present invention end-point detection system utilizing a crystal sensor mounted in a chamber cavity.

Referring now to FIG. 3, wherein a present invention apparatus 40 for determining an end-point in a chamber cleaning process is shown. The block diagram includes a process chamber 42 which has a crystal sensor 44 mounted therein, an external oscillator 43 for exciting the crystal sensor 44 into mechanical motion, a mass flow controller 46 for controlling a flow of a cleaning fluid into the process chamber 42, a signal controller 48 for receiving and outputting a signal to a process controller 50, or a computer. The crystal sensor 44 should be mounted inside a chamber cavity of the process chamber 42 in such a way that it is exposed to process fluids or cleaning fluids utilized in the chamber cavity. As a result, reaction byproducts may be deposited on top of the crystal sensor, and may be subsequently removed by a chamber cleaning process by exposing to a cleaning fluid.

The crystal sensor 44 sends a frequency signal to the signal controller 48. The signal controller 48 analyzes the frequency and calculates the film thickness and then outputs a signal to the system controller 50, or the computer. The system controller 50 then sends a signal to the mass flow controller 46 and the power system to clean the chamber until all the residue film has been cleaned off the chamber walls.

Figure 4:
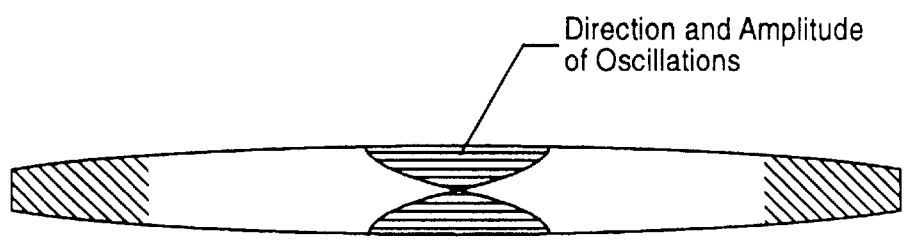
FIG. 4 is a diagram illustrating the direction and amplitude of oscillations of a crystal sensor utilized in the present invention apparatus.

The present invention novel apparatus utilizes a quartz crystal as the basic transducer element. A typical quartz crystal may be one that is supplied by the Maxtek Inc. of Torrance, Calif. under the designation of Model TM-200. The quartz crystal is a flat circular plate that is approximately 0.55 inch or 1.40 cm in diameter, and 0.011 inch or 0.27 mm in thickness. The crystal may be excited into mechanical motion by an external oscillator. The unloaded crystal (i.e. a clean crystal) vibrates in the thickness shear mode at a frequency of approximately 6 megahertz. A typical direction and amplitude of such oscillation shown in a cross-section of crystal vibrating in the thickness shear mode is shown in FIG. 4.

The present invention novel method operates under the principal that the frequency at which the quartz crystal 44 oscillates is lowered by the addition of a film material coated on its surface. It has been found that when the addition of a film layer to a crystal surface produces the same effect as the addition of an equal mass of quartz, the film thickness can be related to the change in crystal oscillating frequency by the equation of:

$$Tk_f = \frac{N_q P_q}{P_f f^2}(f_q - f)$$

where:

N=1.668×10$^5$ m/sec.

Frequency constant for an AT cut quartz crystal vibrating in the thickness shear mode $P_q$=Density of quartz (gm/cubic cm)

$f_q$=Resonant frequency of the uncoated crystal f=Resonant frequency of the loaded crystal TK=Film thickness Pf=Density of the film (gm/cubic cm)

The above equation proves to be adequate in most applications, i.e. in the detection of an end-point in a chamber cleaning process.

A suitable definition for the end-point of a chamber cleaning process has been determined as the point where the output frequency of oscillation from the crystal sensor is not more than 20%, and preferably not more than 10% smaller than the output frequency from a crystal sensor that does not have a film layer coated on top, i.e. a crystal sensor that has a clean surface. For instance, when the output frequency from a crystal sensor with a clean surface is about 6 megahertz, an output frequency of oscillation measured at more than 4.8 megahertz, and preferably more than 5.4 megahertz would indicate that an end-point of the chamber cleaning process has been reached.

the present invention novel method and apparatus for determining end-point in a chamber cleaning process of a semiconductor process chamber have therefore been amply described in the above description and in the appended drawings of FIGS 3 and 4.

while the present invention has been described in an illustrative manner, it should be understood that the terminology used is intended to be in a nature of words of description rather than of limitation.

furthermore, while the present invention has been described in terms of a preferred embodiment, it is to be appreciated that those skilled in the art will readily apply these teachings to other possible variations of the inventions.

the embodiment of the invention in which an exclusive property or privilege is claimed are defined as follows:

What is claimed is:

1. A method for determining end-point in a chamber cleaning process comprising the steps of:

providing a chamber having a cavity for conducting a semiconductor fabrication process therein;

mounting a crystal sensor on a surface of said chamber cavity at a position that the crystal sensor is exposed to gases or liquids used or generated by said fabrication process;

conducting said semiconductor fabrication process in said chamber;

flowing a cleaning fluid into and in-situ cleaning said surface of said chamber cavity;

inputting an oscillating frequency into said crystal sensor and monitoring an output frequency of oscillation from said crystal sensor; and comparing said output frequency of oscillation to an output frequency from a crystal sensor having a clean surface and defining an end-point of said chamber cleaning process when said output frequency of oscillation is not more than 20% smaller than said output frequency from said crystal sensor that has a clean surface.

2. A method for determining end-point in a chamber cleaning process according to claim 1 further comprising the step of mounting a crystal sensor comprising a quartz crystal as the basic transducer element.

3. A method for determining end-point in a chamber cleaning process according to claim 1 further comprising the step of mounting a crystal sensor comprising a quartz crystal in the shape of a flat circular plate.

4. A method for determining end-point in a chamber cleaning process according to claim 1 further comprising the step of mounting a crystal sensor comprising a quartz crystal in the shape of a flat circular plate having a diameter of about 1.5 cm and a thickness of about 0.2 mm.

5. A method for determining end-point in a chamber cleaning process according to claim 1 further comprising the step of inputting an oscillating frequency of at least 3 megahertz into said crystal sensor.

6. A method for determining end-point in a chamber cleaning process according to claim 1 further comprising the step of providing said chamber in a plasma etch chamber.

7. A method for determining end-point in a chamber cleaning process according to claim 1 further comprising the step of providing said chamber in a chemical vapor deposition chamber.

8. A method for determining end-point in a chamber cleaning process according to claim 1 further comprising the step of providing said chamber in a sputter chamber.

9. A method for determining end-point in a chamber cleaning process according to claim 1 further comprising the step of defining an end-point of said chamber cleaning process when said output frequency of oscillation is preferably not more than 10% smaller than said output frequency from a crystal sensor that has a clean surface.

10. A method for determining end-point in a chamber cleaning process according to claim 1 further comprising the step of exciting said crystal sensor into mechanical motion by an external oscillator.

11. A method for determining end-point in a chamber cleaning process according to claim 1 further comprising the step of cooling said crystal sensor during said monitoring step for said output frequency of oscillation from said crystal sensor.

12. A semiconductor process chamber equipped with an end-point detection apparatus for a chamber cleaning process comprising:

a cavity for conducting a fabrication process therein;

a crystal sensor mounted on a surface of said cavity exposed to process and cleaning fluid used in said cavity, said crystal sensor comprises a quartz crystal having a diameter of at least 1 cm and a thickness of at least 0.1 mm;

an external oscillator for providing mechanical motion to said crystal sensor; and a process controller for sensing an output oscillating frequency from said crystal sensor and comparing it to an output oscillating frequency from a crystal sensor that does not have a film coating on top.

13. A semiconductor process chamber equipped with an end-point detection apparatus for a chamber cleaning process according to claim 12, wherein said semiconductor process chamber being selected from the group consisting of a plasma etch chamber, a chemical vapor deposition chamber and a sputter chamber.

14. A semiconductor process chamber equipped with an end-point detection apparatus for a chamber cleaning process according to claim 12, wherein said external oscillator provides an oscillating frequency of at least 3 megahertz.

15. A semiconductor process chamber equipped with an end-point detection apparatus for a chamber cleaning process according to claim 10, wherein said crystal sensor further comprises a cooling means.

* * * * *